(12) United States Patent
Balachandran et al.

(10) Patent No.: US 9,537,493 B2
(45) Date of Patent: Jan. 3, 2017

(54) PHASE LOCK LOOP CIRCUIT HAVING A WIDE BANDWIDTH

(71) Applicant: Robert Bosch GmbH, Stuttgart (DE)

(72) Inventors: Ganesh K. Balachandran, Sunnyvale, CA (US); Vladimir P. Petkov, San Jose, CA (US)

(73) Assignee: Robert Bosch GmbH, Stuttgart (DE)

( * ) Notice: Subject to any disclaimer, the term of this patent is extended or adjusted under 35 U.S.C. 154(b) by 135 days.

(21) Appl. No.: 14/283,702

(22) Filed: May 21, 2014

(65) Prior Publication Data

US 2015/0341041 A1    Nov. 26, 2015

(51) Int. Cl.
| H03L 7/06  | (2006.01) |
| H03L 7/093 | (2006.01) |
| H03L 7/099 | (2006.01) |
| H03L 7/085 | (2006.01) |

(52) U.S. Cl.
CPC ............. H03L 7/093 (2013.01); H03L 7/085 (2013.01); H03L 7/099 (2013.01)

(58) Field of Classification Search
CPC ........................................ H03L 7/093
USPC ........................................ 327/156
See application file for complete search history.

(56) References Cited

U.S. PATENT DOCUMENTS

| 5,604,468 | A | * | 2/1997 | Gillig | .............. | H03L 1/026 |
| | | | | | | 327/105 |
| 5,684,795 | A | * | 11/1997 | Daniel | ............. | H03L 7/1974 |
| | | | | | | 331/1 A |
| 2009/0157783 | A1 | * | 6/2009 | Seo | .............. | G06F 1/0353 |
| | | | | | | 708/276 |
| 2010/0272222 | A1 | * | 10/2010 | Mitani | ............. | H03C 3/0908 |
| | | | | | | 375/376 |
| 2012/0112809 | A1 | * | 5/2012 | Zhu | .............. | H03L 7/1976 |
| | | | | | | 327/157 |
| 2013/0293315 | A1 | * | 11/2013 | Canard | ............ | H03L 7/089 |
| | | | | | | 331/1 A |

OTHER PUBLICATIONS

Rafi, Aslam A. et al., Harmonic Rejection Mixing Techniques Using Clock-Gating, IEEE Journal of Solid-State Circuits, vol. 48, No. 8, Aug. 2013.
"Second order Loop Filter for PLL type 2 block", published prior to May 21, 2014, available at: http://www.scicos.org/ScicosModNum/modnum_web/src/modnum_421/interf/scicos/help/eng/htm/SOLOOPFILTER_f.htm (4 pages).

* cited by examiner

*Primary Examiner* — Ryan Jager
(74) *Attorney, Agent, or Firm* — Maginot Moore & Beck LLP

(57) ABSTRACT

A phase lock loop circuit includes a phase detector, loop filter, voltage controlled oscillator, and a divider. The divider includes a controller and a memory that stores a lookup table of signal levels for a sinusoidal feedback signal. The divider receives an output signal from the voltage controlled oscillator and generates an output signal corresponding to the values in the lookup table in a predetermined order to generate a sinusoidal feedback signal. The divider generates a new output for each cycle of the output signal from the voltage controlled oscillator and enables PLL bandwidth that meets or exceeds a frequency of the reference signal.

4 Claims, 9 Drawing Sheets

PHASE LOCK LOOP CIRCUIT HAVING A WIDE BANDWIDTH

FIELD

This disclosure relates generally to the field of electronic circuits, and, more particularly, to phase lock loop circuits.

BACKGROUND

Phase lock loop circuits (PLLs) are electronic control circuits that are widely employed in radio, telecommunications, computers and other electronic applications. A few common applications of PLLs include signal demodulation, signal recovery from a noisy channel, generation of a stable frequency at multiples of an input frequency (frequency synthesis), and distribution of precisely timed clock pulses in digital logic circuits such as microprocessors. Since a single integrated circuit can provide a complete phase-locked-loop building block, the technique is widely used in modern electronic devices. These circuits can produce output frequencies from a fraction of a hertz up to many gigahertz.

FIG. 7 depicts an arrangement of functional units in a prior art PLL 700 that is configured to generate a higher frequency output signal with reference to a lower frequency input signal. The PLL 700 includes phase detector/phase frequency detector 708, a low-pass loop filter 712, voltage controlled oscillator (VCO) 716 and a frequency divider 720. An external frequency generator produces a reference input signal 704 that is applied to an input of the phase detector 708. The output of the phase detector passes through a loop filter 712 and the filtered output operates the VCO 716. The VCO 716 generates an output signal 740, which is passed to a frequency divider 720 and the output of the frequency divider 720 provides feedback to the phase detector 708. In some embodiments, the phase detector 708 is a multiplier circuit that downconverts the feedback signal to DC (0 Hz) or near DC by modulating it with the reference frequency signal. The VCO 716 is tuned to a range of frequencies corresponding to the higher frequency harmonic so the output of the PLL 740 is a higher frequency multiple of the input reference signal 704.

In situations where the PLL 700 is generating a multiplied frequency output, the higher frequency output signal 740 would not correspond to the lower-frequency input signal 704. The frequency divider 720 receives the higher frequency output 740 and generates a lower frequency output at the same frequency as the input reference signal 704 for the phase detector 708. The phase detector 708 identifies deviations between the phase of the output signal from the frequency divider 720 and the input reference signal 704. If the input reference signal and feedback signal are locked in phase, then the two signals are orthogonal to one another (separated by 90°). The phase detector 708 generates a corrected output signal in response to any errors between the phases of the input and output signals. Thus, the PLL circuit uses a negative feedback loop to correct phase differences between the input reference signal and an output signal.

PLLs that have a wide bandwidth operate with reduced phase noise due to the VCO. As used herein, the term "bandwidth" refers to a frequency that corresponds to the rate at which a PLL circuit can recover from a perturbation between the difference in the phase of the output signal and the input reference signal. A wide bandwidth enables a PLL circuit to operate more efficiently than a PLL circuit with narrower bandwidth because a wide bandwidth PLL filters noise in the output signal from the VCO noise more efficiently and hence for the same noise performance, can use a a VCO that has a higher level of phase noise. The noisier VCO devices also consume less power during operation than lower-noise VCOs that are required for use with narrower bandwidth PLL configurations. In the PLL, the phase noise VCO is a significant power consumer in a PLL, often in excess of >50% of the PLL power, and the high power consumption is needed to reduce the standalone VCO's phase noise. Additionally, a wide PLL bandwidth reduces the phenomenon of VCO pulling, which occurs when a strong RF signal that is close to the VCO frequency, such as a radio transmitter signal, changes the VCO frequency. A wide PLL bandwidth also helps the PLL transition from one frequency to another frequency very quickly.

Existing PLL circuit designs with high bandwidth often have difficulty operating in a stable manner. For example, the maximum theoretical bandwidth in a typical prior art PLL is one-half of the input reference frequency, but practical PLL embodiments must operate with much narrower frequency bandwidths (typically one-tenth of the reference frequency) because the output signal from the frequency divider is not a continuous-time phase signal but is typically sampled at discrete time intervals. For example, as depicted in FIG. 9, a high frequency VCO output signal 904 completes four cycles 908A-908D during a single cycle 912 of a lower-frequency divider that is depicted by the samplings signal 920. The lower-frequency divider samples at rising edges 924 and 928, which can only effectively identify an average for the jitter and other high-frequency characteristics of the signal 904 over four cycles instead of identifying the jitter for individual cycles of the high-frequency VCO signal 904. The lower-frequency sampling frequency 920 for the divider results in aliasing of the higher-frequency VCO signal 904 where information about phase errors that are introduced due to jitter and other signal noise is lost in the feedback signal. As is known in the art, sampling of an output signal, especially high-frequency output signals, is prone to generation of aliased output signals due to the high frequency content in the output signal from the VCO. Inaccuracies in the output of the divider due to the aliasing in the divider often accumulate to produce an unstable output signal.

To overcome limitations in bandwidth, prior art circuits often include a series of two or more PLLs to generate an output signal. FIG. 8 depicts a configuration of two PLLs 820 and 850 that are connected in series. In FIG. 8, the first PLL 820 has a bandwidth of approximately 200 kHz and the second PLL 850 has a bandwidth of approximately 5 MHz. However, requiring a series of PLLs increases the complexity of circuit design. Consequently, improvements to PLLs that enable stable operation of a single stage PLL with wide bandwidth would be beneficial.

SUMMARY

In one embodiment, a phase lock loop (PLL) circuit that operates with a wide bandwidth has been developed. The PLL circuit includes a phase detector having a first input that receives a reference signal with a predetermined waveform at a first frequency and a second input that receives a feedback signal, the phase detector being configured to generate a control signal with reference to the reference signal and the feedback signal, a loop filter having an input that receives the control signal from an output of the phase detector, the loop filter being configured to generate a filtered control signal, a voltage controlled oscillator (VCO)

having an input that receives the filtered control signal from the loop filter, the VCO being configured to generate an output signal having a second frequency that corresponds to a multiple of the first frequency of the reference signal, and a divider having an input that receives the output signal from the VCO. The divider includes a memory configured to store a lookup table of a plurality of discrete values corresponding to the input waveform, and a controller operatively connected to the memory, the input of the divider, and an output of the divider. The controller is configured to detect a plurality of clock edges in the output signal from the VCO, select one of the plurality of discrete values in response to each detected clock edge, the discrete values being selected in a predetermined order corresponding to the input waveform, and generate the feedback signal with reference to each selected value for the second input of the phase detector for each clock edge.

DETAILED DESCRIPTION

For the purposes of promoting an understanding of the principles of the embodiments described herein, reference is made to the drawings and descriptions in the following written specification. No limitation to the scope of the subject matter is intended by the references. The description also includes any alterations and modifications to the illustrated embodiments and includes further applications of the principles of the described embodiments as would normally occur to one skilled in the art to which this document pertains.

Figure 1:
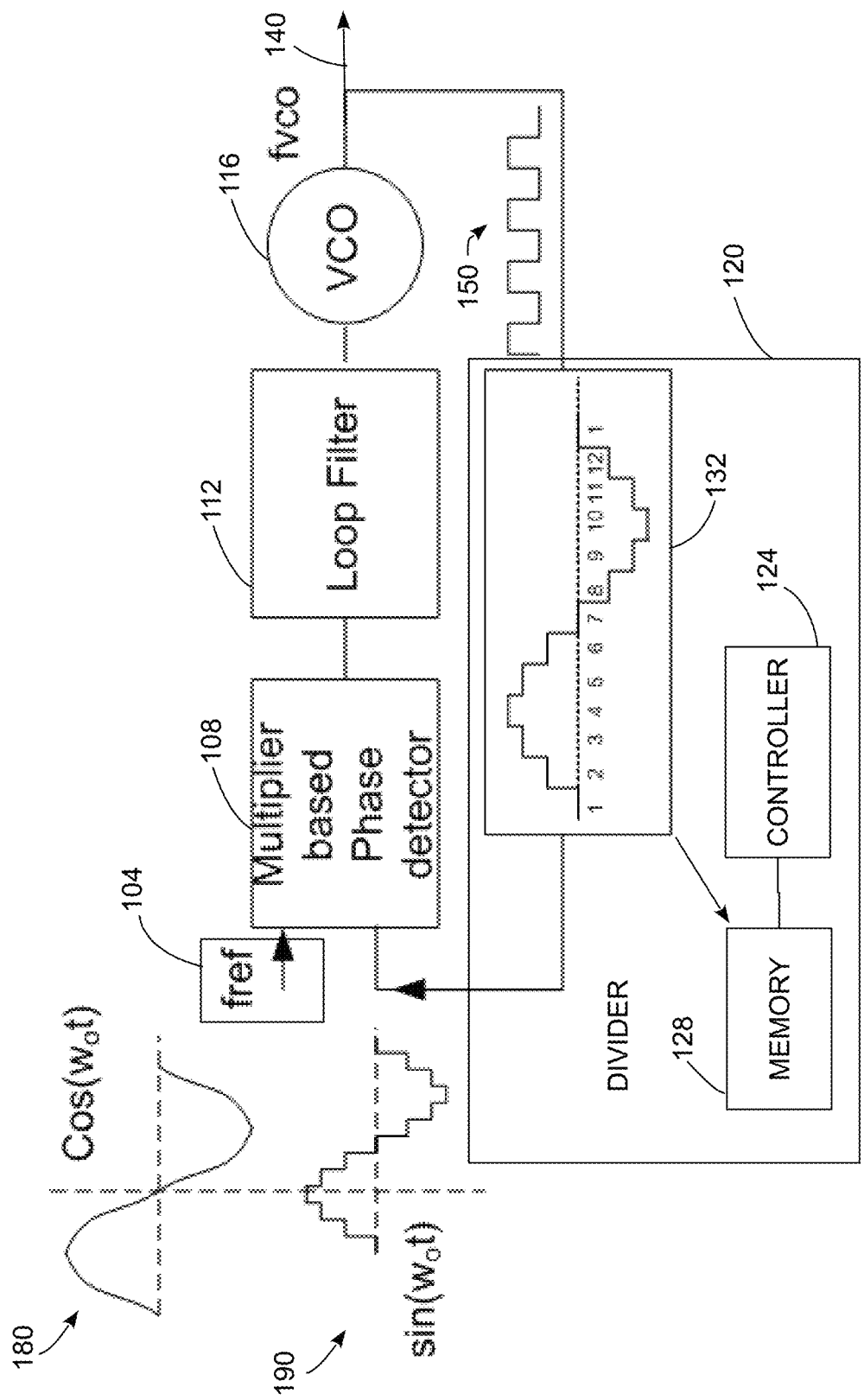
FIG. 1 is a schematic diagram of a phase lock loop circuit that enables wide bandwidth operation.

FIG. 1 is a diagram of a phase lock loop (PLL) circuit 100 that operates in a stable manner with a frequency bandwidth that is equal to or greater than the frequency of an input reference signal. The PLL 100 includes a multiplier-based phase detector 108, loop filter 112, voltage controlled oscillator (VCO) 116, and a divider 120. The PLL 100 receives an input reference signal from a reference signal generator 104, such as a crystal oscillator or any other signal generation device that generates a sinusoidal reference signal for the PLL 100. The multiplier based phase detector 108 includes two inputs that receive the reference signal and an output of the divider 120 that provides negative feedback. If the phases from the reference signal and the feedback signal from the divider 120 are not orthogonal to one another (e.g. separated by 90°), then the phase detector 108 generates a non-zero control signal to adjust the operation of the VCO 116 to correct the phase error. The loop filter 112 filters the control signal from the phase detector 108 and the VCO 116 receives the filtered control signal from the loop filter 112. The VCO 116 generates an output signal with reference to the filtered output of the phase detector 108. The negative feedback loop in the PLL 100 enables the filtered output of the phase detector 108 to modify operation of the VCO 116 so the phase of the output signal converges with the phase of the reference signal to correct the error. In FIG. 1, the signal graph 180 depicts a sinusoidal reference signal (cos $(w_0 t)$) and the graph 190 depicts a stepped sinusoidal approximation of the negative feedback signal 190 (sin $(w_0 t)$) from the divider 120 that is generated when the PLL is locked and the negative feedback signal is orthogonal to the reference signal. In alternative embodiments, the reference signal 180 includes waveform other than a sinusoidal waveform. Examples of reference waveforms include, but are not limited to, sawtooth waveforms, triangular waveforms, parabolic waveforms, square waveforms, and the like. The divider 120 continues to generate the feedback signal 190 with a sinusoidal waveform even if the reference signal does not have a sinusoidal waveform.

In the illustrative example of FIG. 1, the PLL 100 is configured to generate an output signal with a frequency that is multiplied by a factor of twelve from the frequency of the input reference signal, but alternative configurations multiply the input signal by larger or smaller factors. The VCO 116 includes an output to transmit the generated output signal both for an output terminal 140 and as feedback to an input of the divider 120. In the example of FIG. 1, the VCO 116 generates a square wave output signal 150 that is commonly used as a clock signal both for controlling other synchronized logic components that are connected to the output 140 and for control of the divider 120.

In the PLL 100, the divider 120 includes a controller 124 and memory 128. The memory 128 includes a lookup table with a plurality of discrete stepped sinusoidal values. FIG. 1 depicts a series of discrete values graphically as the stepped sinusoidal waveform 132 that approximates the sinusoidal waveform of the reference signal. The lookup table in the memory 128 stores the sinusoidal waveform 132, which includes twelve discrete lookup table entries (12 "steps") that correspond to one cycle of a sinusoid. The controller 124 is, for example, a digital logic circuit that detects edges in an output signal waveform 150 that is generated by the VCO 116. The VCO generates the output signal 150 with a frequency that is a multiple of the input reference signal from the signal generator 104.

Figure 2:
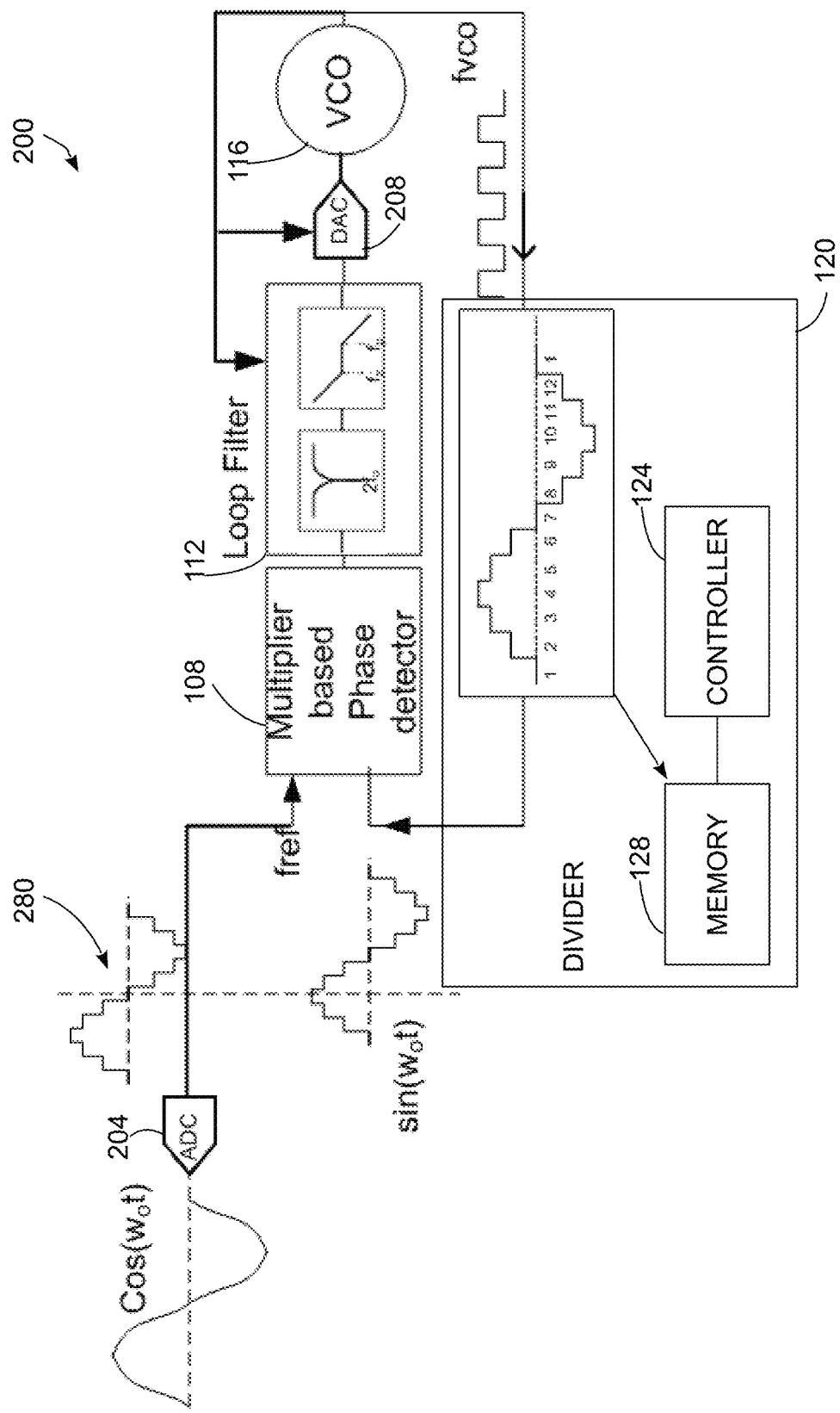
FIG. 2 is a schematic diagram of an embodiment of the PLL of FIG. 1 that includes digital control components.
Figure 3:
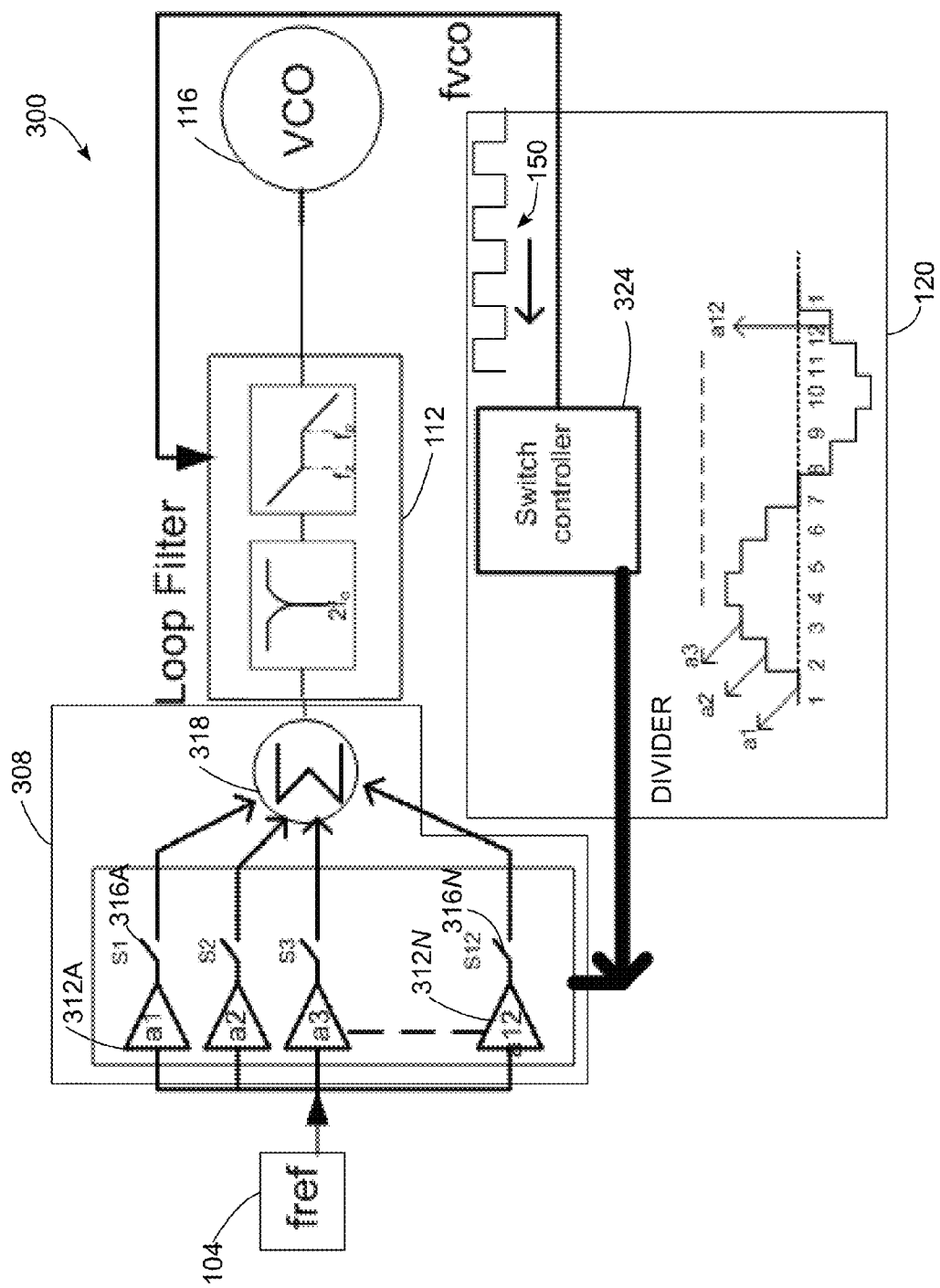
FIG. 3 is a schematic diagram of an embodiment of the PLL of FIG. 1 that includes analog control components.

FIG. 2 and FIG. 3 are circuit diagrams of two different embodiments of the PLL 100 from FIG. 1. Both of the embodiments of FIG. 2 and FIG. 3 operate in substantially the same manner as the PLL 100, but include different circuit configurations. FIG. 2 depicts a digital PLL circuit 200 that includes an analog to digital converter (ADC) 204 and digital to analog converter (DAC) 208. The ADC 204 generates a digital representation 280 of the reference signal that is supplied to one input of the phase detector 108. The phase detector 108 then generates the control signal with reference to the stepped sinusoidal feedback signal from the divider 120. The DAC 208 is connected to the output of the loop filter 112 and generates an analog representation of the filtered control signal to control the output of the VCO 116.

FIG. 3 depicts an analog PLL circuit 300 embodiment of the PLL. In the PLL circuit 300, the phase detector 308 includes a series of amplifiers 312A-312N and a corresponding series of switches 316A-316N that are connected to the outputs of the amplifiers 312A-312N, respectively. The number of amplifiers and switches depend on the number of steps in the feedback stepped sinusoidal waveform, which is twelve in the illustrative embodiment of FIG. 3. The output from each of the switches 316A-316N is connected to a summation circuit 318 that generates the control output signal for the loop filter 112. The divider 120 includes a switch controller 324 that includes, for example, a modulo counter that increments in response to the clock edges of the output signal 150. The counter in the switch controller 324 is coupled with a decoder output that selectively opens and closes the switches 316A-316N based on the value of the counter. While the PLL 300 does not include a standard digital memory device to store a lookup table, the decoded output from the switch controller 324 and the switches 316A-316N act as a lookup table in a memory. During each clock cycle in the output signal from the VCO 116, the switch controller 324 closes one of the switches 316A-316N and opens the remaining switches. The amplifiers 312A-312N are each configured with different gains (weights) to achieve the same multiplication effect that occurs in PLL circuit 200. If the two signals are phase locked then the average output from the loop filter is 0 at DC (0 Hz), although some higher-frequency components are present in the output signal from the phase detector 308 and the loop filter 112 attenuates the higher-frequency components. If the PLL 300 loses phase lock, the output from the loop filter becomes non-zero value as the DC output from the amplifiers 312A-312N becomes non-zero. The phase detector 308 in the PLL 300 is also referred to as a harmonic reject mixer.

During operation of the PLLs in FIG. 1-FIG. 3, the divider 120 receives the output signal 150 from the VCO 116. The controller 124 identifies rising edges in the output signal 150 and selects a next discrete value from the lookup table in the memory 128 to generate a new output from the divider 120 for each cycle of the output signal 150. In digital embodiments, the controller 124 is, for example, a digital logic circuit that includes flip-flops or other synchronous logic that detect edges in the output signal 150, such as rising or falling edges, and selects output values from the lookup table in the memory 128 in a predetermined order to generate the negative feedback output signal. For example, in one embodiment the controller 124 implements a modulo counter that increments in response to each rising edge of the output signal from zero to N−1 where N is the number of entries in the lookup table (twelve in the example of FIG. 1), then returns to zero and continues incrementing from zero to N−1 in a cyclical manner. The discrete values in the lookup table are arranged in a predetermined order to generate the stepped sinusoidal output waveform 132 as the controller 124 increments through the modulo counter. In the analog embodiments, the controller 324 is a switch controller with the modulo counter and a decoder to operate switches in an array of switches for the harmonic reject mixer. In both the digital and analog embodiments, the divider 120 generates the output from each lookup table entry in response to each clock signal edge that is received from the VCO 116.

Figure 4:
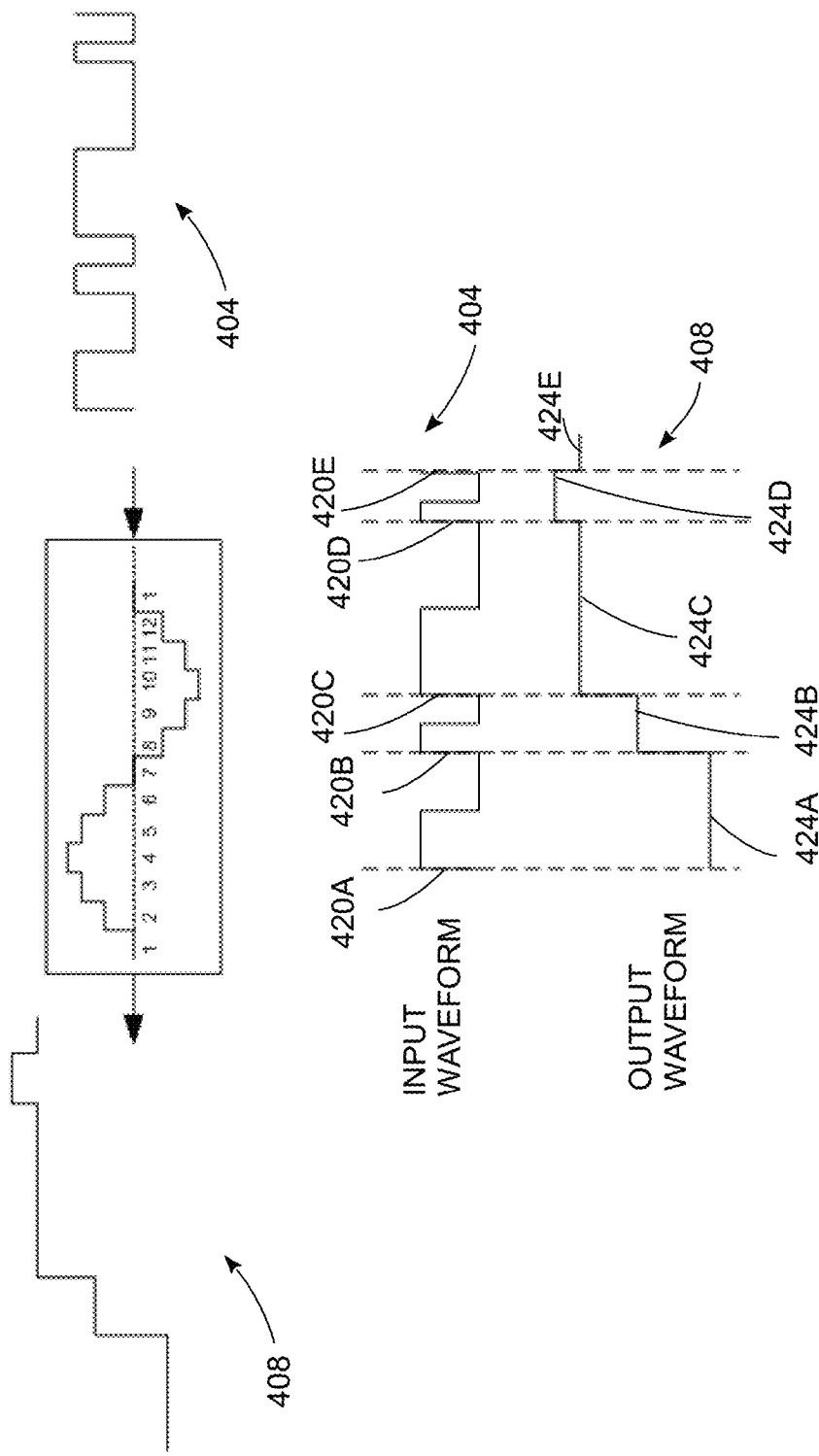
FIG. 4 is a diagram depicting generation of an output signal from a divider in the PLL embodiments of FIG. 1-FIG. 3 based on each clock cycle from an output voltage controlled oscillator.

FIG. 4 depicts the generation of the negative feedback signal from the divider 120 in response to the output signal from the VCO 116 in more detail. FIG. 4 depicts an output clock signal 404 from the VCO 116 that is depicted with a large degree of jitter for illustrative purposes. The input waveform 404 includes rising clock edges at references 420A, 420B, 420C, 420D and 420E. In the divider 120, the controller 124 identifies the rising clock edges and selects an output from the lookup table in the memory 128 in response to each rising clock edge, although one alternative embodiment detects falling clock edges. Still another embodiment detects both rising and falling clock edges with a lookup table that includes twice the number of entries than the multiplication factor in the PLL and a larger number of discrete levels corresponding to the reference signal. The output waveform 408 includes discrete output levels 424B, 424B, 424C, 424D, and 424E that are generated in response to the clock edges 420A-420E, respectively. The signal levels 424A-424E depict a rising portion of the stepped sinusoidal output signal that corresponds to the sinusoidal reference signal. The time period for the output of the divider 120 at each of the levels 424A-424E are substantially the same as the period of each clock cycle in the output signal 404. In situations where jitter affects the cycle period and correspondingly the phase of the output signal, the negative feedback signal 408 includes jitter information from each cycle of the VCO output signal 404.

Figure 9:
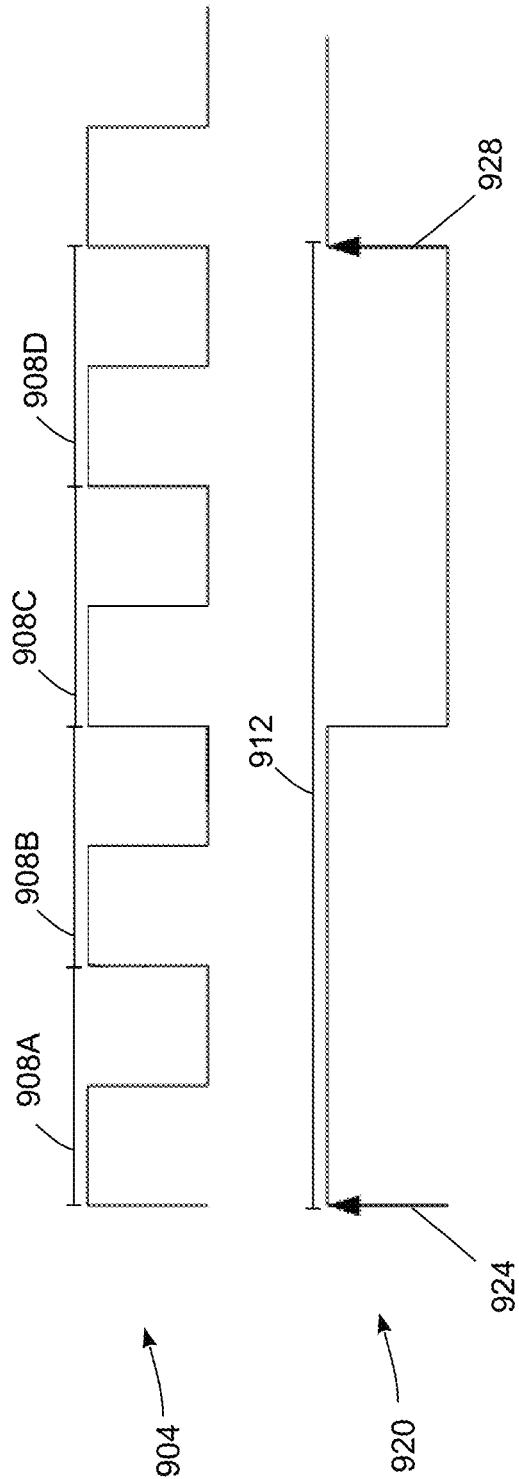
FIG. 9 is a graph that depicts the effects of aliasing in prior art PLL circuits due to the reduced sampling frequency of the divider in the prior art PLL circuits.

As discussed above with regards to FIG. 9, prior art dividers that sample the VCO output signal at a divided rate instead of at the full frequency of the output signal do not effectively measure the jitter in some or all of the intermediate output clock cycles, and the resulting output signal from the divider often includes inaccurate phase information. The inaccurate phase information can result in the instability of prior art PLLs at larger bandwidths. By contrast, the divider 120 operates at a sampling rate of the VCO frequency, which is considerably higher than the reference frequency. For example, in the PLL circuit 100 the VCO output signal frequency is twelve times higher than the reference signal frequency, which greatly exceeds the Nyquist rate of twice the frequency of the reference signal. Other PLL embodiments include even higher multipliers for the VCO output frequency such as multipliers of several hundred or thousand times the frequency of the reference signal. Since the lookup table stores a close approximation of the waveform for the reference signal, the divider 120 merely selects the next output that the controller produces based on the timing of the higher frequency output signal from the VCO 116. The divider 120 does not suffer from aliasing effects due to operating with a reduced sampling rate to generate the frequency-divided output signal in the same manner as prior art dividers. Instead, the divider 120 changes output at the full frequency of the output signal from the VCO 116, but each change in output corresponds to an incremental portion of the reference waveform instead of generating the entire reference waveform based on a lower-frequency sampling process that is susceptible to the aforementioned aliasing. Thus, the PLL 100 operates with a bandwidth that meets or exceeds the frequency of the input reference signal. As depicted above, the divider 120 generates one-twelfth of the feedback waveform at the same frequency corresponding to the reference signal for each cycle of the output waveform from the VCO 116. In other configurations, the divider 120 generates an incremental output corresponding to a 1/N portion of the reference signal during each cycle of the output signal where N is the frequency multiplication factor for the PLL.

In the PLL 100, the phase detector 108 generates a control signal if the reference signal and feedback signal are not locked in phase and ideally has zero output when the reference signal 180 and feedback signal 190 are in a locked state when the signals are separated by 90°. However, the control signal output from the phase detector 108 in the PLL 100 also generates a spurious harmonic signal that is centered at twice the frequency $w_0$ of the reference signal. In the PLL 100, the loop filter 112 includes a notch filter that removes the unwanted harmonic from the control signal generated in the phase detector 108.

Figure 5:
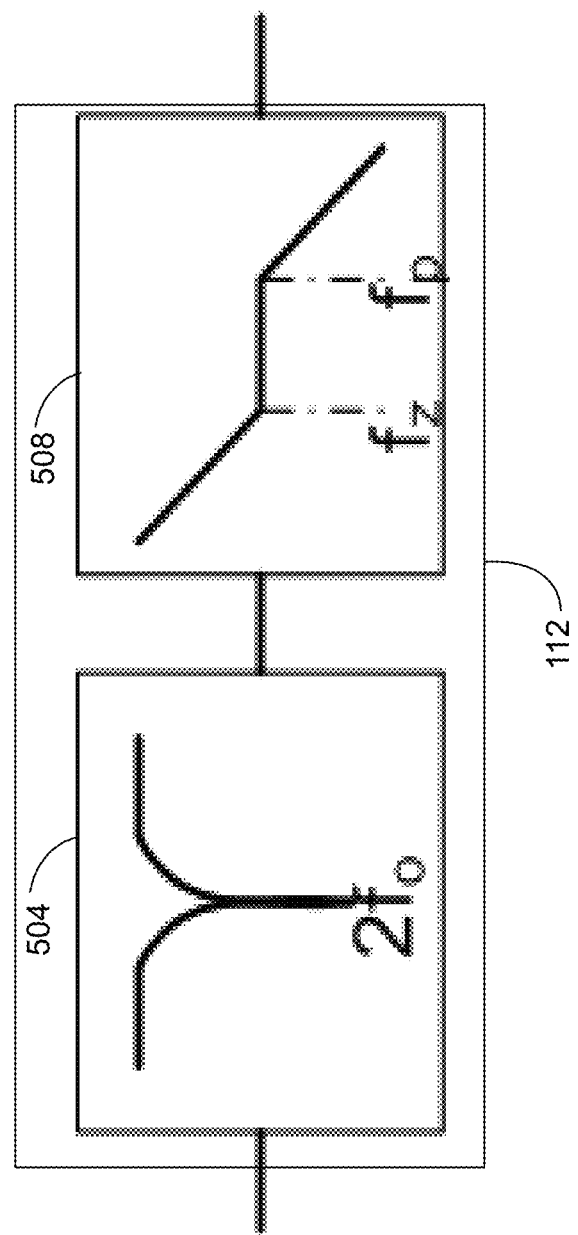
FIG. 5 is a diagram of a loop filter that includes a notch filter in the PLL embodiments of FIG. 1-FIG. 3.

FIG. 5 depicts the loop filter 112 in more detail. In FIG. 5, the loop filter 112 includes a notch filter 504 that is connected to the input of the loop filter 112 to receive the control signal from the phase detector 108, and an zero-pole-integrator filter 508 that receives the notch-filtered signal. The output of the the filter 508 is the filtered control signal from the loop filter 112 that is delivered to the input of the VCO 116. In FIG. 5 the notch filter 504 has the following characteristic equation:

$$\frac{z^2 - 2\cos(2w_0 T_{clk}) + 1}{z^2 - 2r\cos(2w_0 T_{clk}) + r^2}$$

where $T_{clk}$ is the time period of the output signal from the VCO 116 and r defines the steepness of the notch (0<r<1). The rest of the loop filter 508 is characterized by the following equation:

$$\frac{1 - az^{-1}}{(1 - z^{-1})(1 - bz^{-1})}$$

where a determines the zero frequency (0<a<1) and b determines the pole frequency (0<b<1). The notch filter 504 removes the higher frequency harmonic from the output signal of the phase detector 108. However, in some PLL circuit embodiments the notch filter 504 can be removed when the introduction of the higher-frequency harmonic does not prevent operation of the PLL circuit. For example, if the PLL circuit 100 generates an output clock signal to drive a digital logic device such as a microprocessor or other digital logic circuit, the higher frequency harmonics do not interfere with the operation of the digital logic device and the notch filter 504 is optionally omitted. In other configurations, such as use in radio-frequency (RF) applications, the notch filter 504 removes higher-frequency noise that negatively affects the operation of devices that receive the output signal from the PLL circuit 100.

While FIG. 5 depicts a loop filter that is configured with a single notch for illustrative purposes, alternative embodiments of the loop filter optionally include filters with transfer functions that produce notches at higher-frequency harmonics of the frequency for the reference signal in situations where the multiplier in the phase detector 108 generates non-trivial energy at higher frequency harmonics of the reference signal. In particular, the notch filter 504 with a signal notch is effective when the reference signal is a sinusoidal waveform, such as the reference signals 180 in FIGS. 1 and 280 in FIG. 2. However, if the reference waveform is another waveform, then the notch filter 504 is further configured with additional notches at higher frequency harmonics of the reference signal frequency to remove the high-frequency noise at harmonics that would negatively affect operation of the PLL circuit 100 or other components that receive the output signal from the PLL circuit 100.

Figure 6:
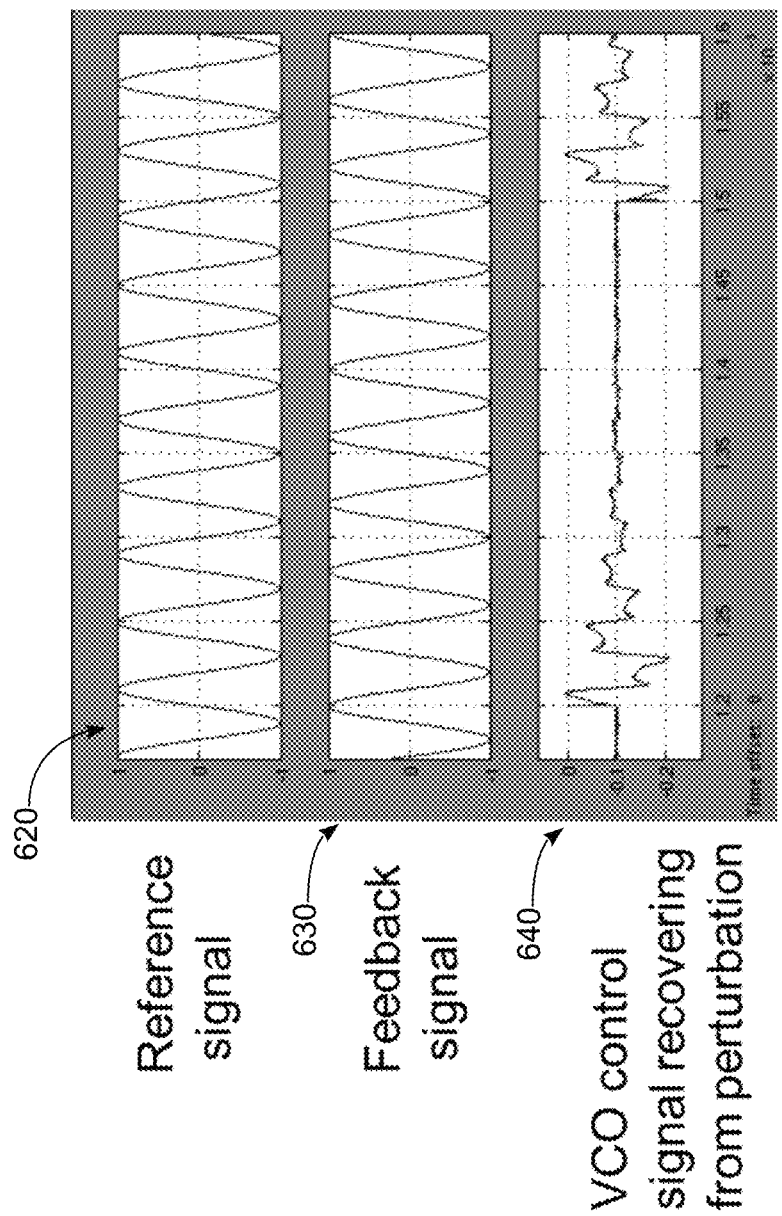
FIG. 6 is a set of graphs depicting an illustrative reference signal waveform, feedback signal waveform, and control signals for a voltage controlled oscillator to maintain a phase lock in the PLL embodiments of FIG. 1-FIG. 3.
Figure 7:
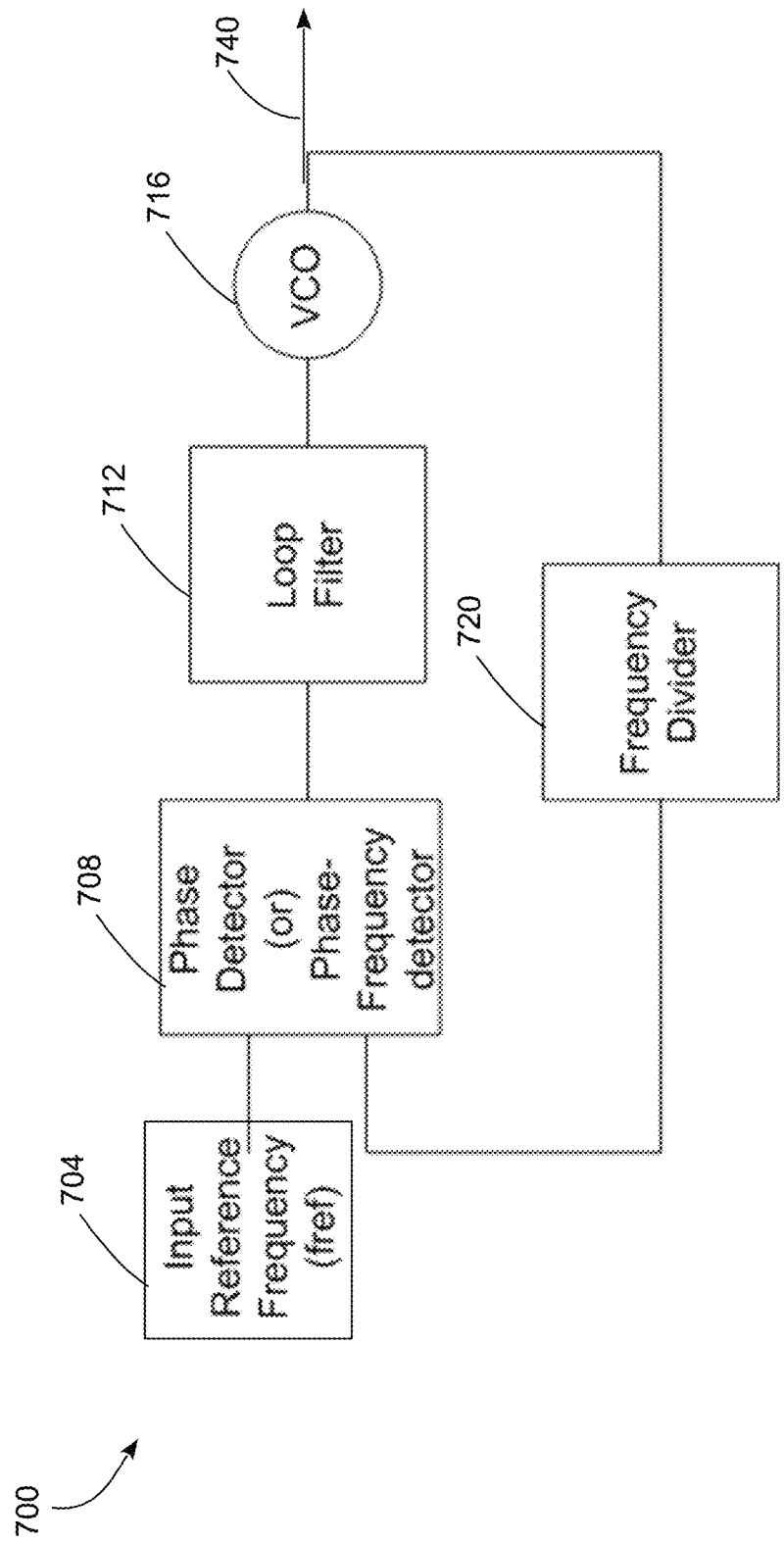
FIG. 7 is a schematic diagram of a prior art phase lock loop circuit.
Figure 8:
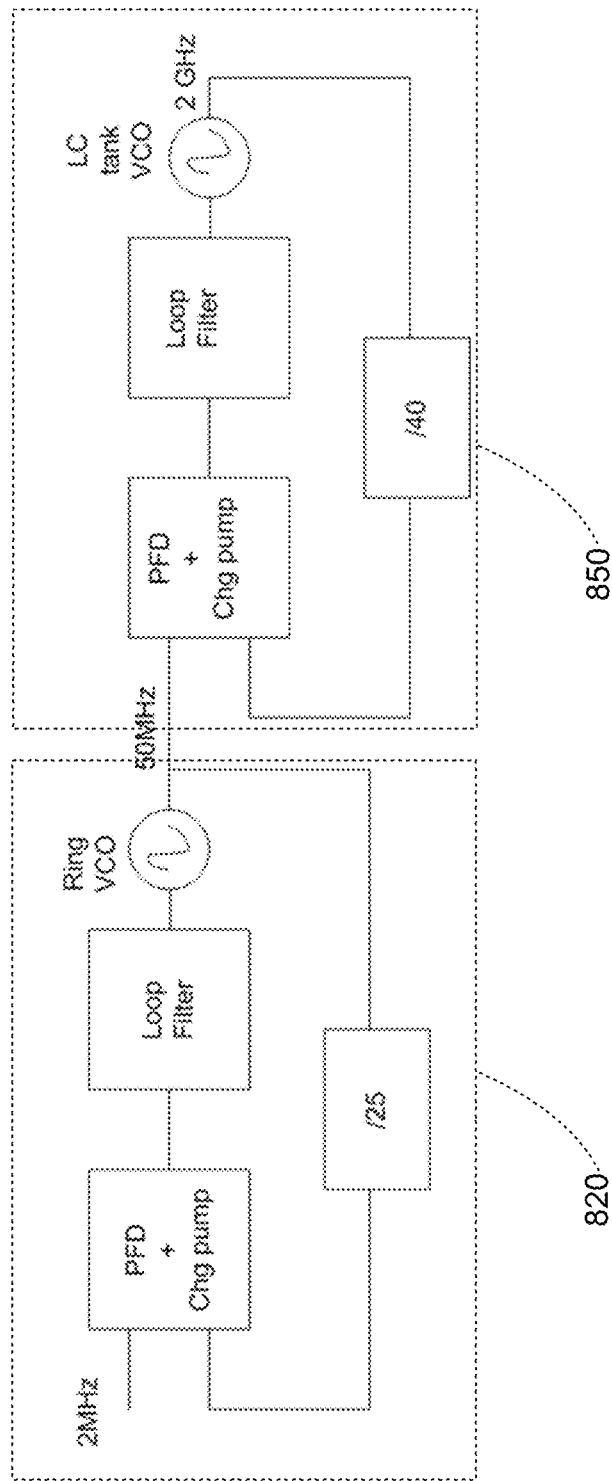
FIG. 8 is a schematic diagram of a prior art two-stage phase lock loop circuit.

FIG. 6 depicts example signal waveforms generated during the operation of the PLL 100. In FIG. 6, the reference signal 620 is a sinusoidal waveform at a predetermined reference frequency. The feedback signal 630 is another sinusoidal waveform that the PLL generates at the same frequency as the reference signal. If the output of the PLL is properly phase locked to the reference signal 620, then the feedback signal 630 has a phase offset of 90° from the reference signal 620. During operation, the PLL 100 corrects perturbations that may occur in the phase of the output signal compared to the reference signal. The graph 640 depicts the filtered control signal that the VCO 116 receives in response to the phase detector 108 identifying a phase mismatch between the reference signal 620 and feedback signal 630. The amplitude of the filtered control signal drops as the PLL reestablishes a phase lock with the reference signal.

It will be appreciated that variants of the above-described and other features and functions, or alternatives thereof, may be desirably combined into many other different systems, applications or methods. For example, the PLL circuits described above are suitable for, but not limited to, MEMS oscillators, gyroscope drives, piezoelectric drives for scanning mirrors, and the like. The PLLs described above are also useful in systems where the PLL locks to a low frequency oscillator, such as a 32.768 kHz signal from a real time clock, and produces a high frequency outputs, such as a 1 GHz or higher local oscillator clock signal from a VCO. Various presently unforeseen or unanticipated alternatives, modifications, variations or improvements may be subsequently made by those skilled in the art that are also intended to be encompassed by the following claims.

What is claimed:

1. A phase lock loop circuit comprising:
   a phase detector having a first input that receives a reference signal with a predetermined waveform at a first frequency and a second input that receives a feedback signal, the phase detector being configured to generate a control signal with reference to the reference signal and the feedback signal;
   a loop filter having an input that receives the control signal from an output of the phase detector, the loop filter being configured to generate a filtered control signal;
   a voltage controlled oscillator (VCO) having an input that receives the filtered control signal from the loop filter, the VCO being configured to generate an output signal having a second frequency that corresponds to a multiple of the first frequency of the reference signal;
   an analog to digital converter operatively connected to the first input of the phase detector to convert the reference signal to a digital reference signal for input to the phase detector; and
   a digital to analog converter operatively connected to the output of the loop filter to convert a digital filtered control signal from the loop filter to an analog filtered control signal for the input of the VCO; and
   a divider having an input that receives the output signal from the VCO, the divider further comprising:
      a memory configured to store a lookup table of a plurality of discrete values corresponding to a sinusoidal feedback waveform; and
      a controller operatively connected to the memory, the input of the divider, and an output of the divider, the controller being configured to:
         detect a plurality of clock edges in the output signal from the VCO;
         select one of the plurality of discrete values corresponding to the sinusoidal feedback waveform stored in the memory in response to each detected clock edge, the discrete values being selected in a predetermined order corresponding to the output signal from the VCO received at the input of the divider; and generate the feedback signal for the second input of the phase detector as a sinusoidal waveform with reference to each selected discrete value in the plurality of discrete values corresponding to the sinusoidal feedback waveform stored in the memory.

2. The phase lock loop circuit of claim 1, the loop filter further comprising:

a notch filter configured to attenuate an output of the phase detector around a frequency corresponding to twice the first frequency of the reference signal.

3. The phase lock loop circuit of claim 2, the loop filter further comprising:

an zero-pole-integrator having an input operatively connected to an output of the notch filter.

4. The phase lock loop circuit of claim 1 wherein the VCO generates the output signal with a square waveform that includes the plurality of clock edges.

* * * * *